US012607670B2

(12) United States Patent
Ouyang et al.

(10) Patent No.: US 12,607,670 B2
(45) Date of Patent: Apr. 21, 2026

(54) METHOD AND APPARATUS FOR TESTING A PACKAGE-ON-PACKAGE SEMICONDUCTOR DEVICE

(71) Applicant: CHROMA ATE INC., Taoyuan (TW)

(72) Inventors: Chin-Yi Ouyang, Taoyuan City (TW);
Xin-Yi Wu, Taoyuan City (TW);
Chien-Ming Chen, Taoyuan City (TW);
Meng-Kung Lu, Taoyuan City (TW);
Chia-Hung Chien, Taoyuan City (TW)

(73) Assignee: CHROMA ATE INC., Taoyuan City (TW)

( * ) Notice: Subject to any disclaimer, the term of this patent is extended or adjusted under 35 U.S.C. 154(b) by 359 days.

(21) Appl. No.: 18/299,173

(22) Filed: Apr. 12, 2023

(65) Prior Publication Data

US 2023/0349968 A1     Nov. 2, 2023

(30) Foreign Application Priority Data

Apr. 29, 2022    (TW) .................................. 111116376

(51) Int. Cl.
*G01R 31/28*          (2006.01)
(52) U.S. Cl.
CPC ..... *G01R 31/2896* (2013.01); *G01R 31/2887* (2013.01); *G01R 31/2893* (2013.01)
(58) Field of Classification Search
CPC ............ G01R 31/2896; G01R 31/2887; G01R 31/2893; G01R 31/2868
See application file for complete search history.

(56) References Cited

U.S. PATENT DOCUMENTS

| | | | | |
|---|---|---|---|---|
| 8,822,271 B2* | 9/2014 | Joh | ...................... | H01L 25/0657 |
| | | | | 438/109 |
| 2013/0168203 A1* | 7/2013 | Nakajima | .......... | G01R 31/2893 |
| | | | | 198/339.1 |
| 2015/0226794 A1* | 8/2015 | Chen | .................... | G01R 1/0433 |
| | | | | 324/756.02 |
| 2015/0260793 A1* | 9/2015 | Chen | .................. | G01R 31/2863 |
| | | | | 324/756.01 |

* cited by examiner

*Primary Examiner* — Lee E Rodak
*Assistant Examiner* — Zannatul Ferdous
(74) *Attorney, Agent, or Firm* — McClure, Qualey & Rodack, LLP

(57)                ABSTRACT

The present invention relates to an apparatus for testing a package-on-package semiconductor device, mainly comprising a pick-and-place device, a test socket, an upper chip holder, and a main controller. When a first package device is to be tested, the main controller controls the pick-and-place device to load the first package device into the test socket and then controls the pick-and-place device to transfer the upper chip holder and bring the upper chip holder into electrical contact with the first package device on the test socket so that a second package device in the upper chip holder is electrically connected to the first package device for testing. Accordingly, the upper chip holder is an independent component. Only when a test is executed, the pick-and-place device transfers the upper chip holder onto the test socket so that the second package device is electrically connected to the first package device.

4 Claims, 5 Drawing Sheets

METHOD AND APPARATUS FOR TESTING A PACKAGE-ON-PACKAGE SEMICONDUCTOR DEVICE

BACKGROUND OF THE INVENTION

The present invention relates to a method and apparatus for testing a package-on-package semiconductor device, particularly a method and apparatus for testing electrical characteristics or functions of a package-on-Package semiconductor device.

With the requirement for the lightweight and compactness of electronic products and their performances, the current semiconductor package technology focuses on integrating more electronic elements in a limited space. One of solutions is Package-on-Package (POP) technology for stacking at least two packages in three-dimensional space (in the height direction) to form a 3D system in package (SiP). Accordingly, the package-on-package has the advantage that it occupies less printed circuit board (PCB) space and simplifies the circuit board design, as compared with the traditional side-by-side package and that frequency performance is improved by direct connection of the memories and logic circuits.

Generally, an upper chip and a lower chip are tested separately before they are stacked and packaged. After both of them pass the tests, they are stacked, wire bonded, and packaged to form a final product. Since the test of a lower chip has to be performed with cooperation of an upper memory chip for testing the functions of the lower chip, the method for testing the lower chip is obviously more complicated than the method for testing a general simple electronic device.

U.S. Pat. No. 9,519,024 B2 entitled "Apparatus for Testing Package-on-Package Semiconductor Device and Method for Testing the Same" discloses that when a test is to be performed, a lifting and rotating arm moves a chip placement module having an upper chip (a memory chip) accommodated therein to a position between a pick-and-place device and a test socket, and then the pick-and-place device together with the chip placement module is lowered to electrically contact a lower chip for testing the lower chip. When the test is completed, the pick-and-place device is lifted together with the chip placement module, and then the lifting and rotating arm moves the chip placement module away from the pick-and-place device and to one side of the pick-and-place device.

In order to realize the test of a package-on-package semiconductor device, the apparatus as disclosed in U.S. Pat. No. 9,519,024 B2 is especially provided with a lifting and rotating arm for lifting movement and rotational movement. As a result, the mechanism of the overall apparatus is complex and bulky, and the entire test process is too complicated, and the test efficiency is poor.

SUMMARY OF THE INVENTION

The main object of the present invention is to provide a method and apparatus for testing a package-on-package semiconductor device so as to test the package-on-package semiconductor device in a full automatic manner, significantly simplify the components of the apparatus to improve reliability and reduce cost, and greatly increase test efficiency and test accuracy.

To achieve the above object, an apparatus for testing a package-on-package semiconductor device mainly comprises a pick-and-place device, a test socket, an upper chip holder, and a main controller, wherein the test socket is provided for accommodating a first package device; a second package device is accommodated in the upper chip holder; the main controller is electrically connected to the pick-and-place device and the test socket. When the first package device is to be tested, the main controller controls the pick-and-place device to load the first package device into the test socket and then controls the pick-and-place device to transfer the upper chip holder and bring the upper chip holder into electrical contact with the first package device on the test socket so that the second package device is electrically connected to the first package device for execution of a test of the first package device.

Accordingly, the upper chip holder of the present invention is an independent component. Only when the test is to be performed, the pick-and-place device transfers the upper chip holder onto the test socket so that the second package device is electrically connected to the first package device, thereby forming a complete package-on-package chip structure for execution of the test. Therefore, the present invention greatly simplifies the complex mechanical components of the conventional apparatus for testing a package-on-package chip, significantly reduces cost, and increases reliability. When there is a need to change the specification of the device under test, it is only necessary to simply replace the upper chip holder or test socket. Therefore, the present invention is quite flexible.

To achieve the above object, a method for testing a package-on-package semiconductor device comprises the steps of: controlling a pick-and-place device to load a first package device into a test socket by a main controller; controlling the pick-and-place device to pick an upper chip holder, in which a second package device is accommodated, by the main controller; and controlling the pick-and-place device to transfer the upper chip holder and bring the upper chip holder into electrical contact with the first package device on the test socket by the main controller so that the second package device is electrically connected to the first package device for execution of a test of the first package device.

Accordingly, the testing method of the present invention effectively simplifies the conventional complex steps of testing a package-on-package semiconductor device. The upper chip holder is transferred onto the test socket only when the test is to be carried out; and the upper chip holder is moved out of the test socket after the test is completed so that the test efficiency is optimized.

DETAILED DESCRIPTION OF THE INVENTION

Figure 1:
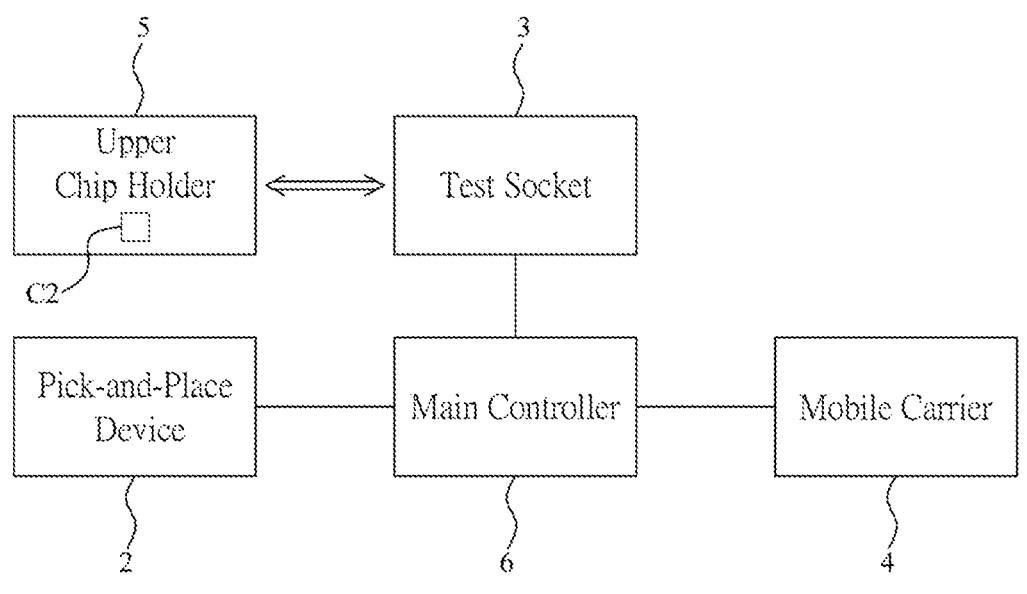
FIG. 1 is an architecture diagram of an apparatus according to a first embodiment of the present invention.

Before a method and apparatus for testing a package-on-package semiconductor device according to the present invention is described in detail in embodiments, it should be noted that in the following description, similar components will be designated by the same reference numerals. Furthermore, the drawings of the present invention are for illustrative purposes only, they are not necessarily drawn to scale, and not all details are necessarily shown in the drawings.

Figure 2A:
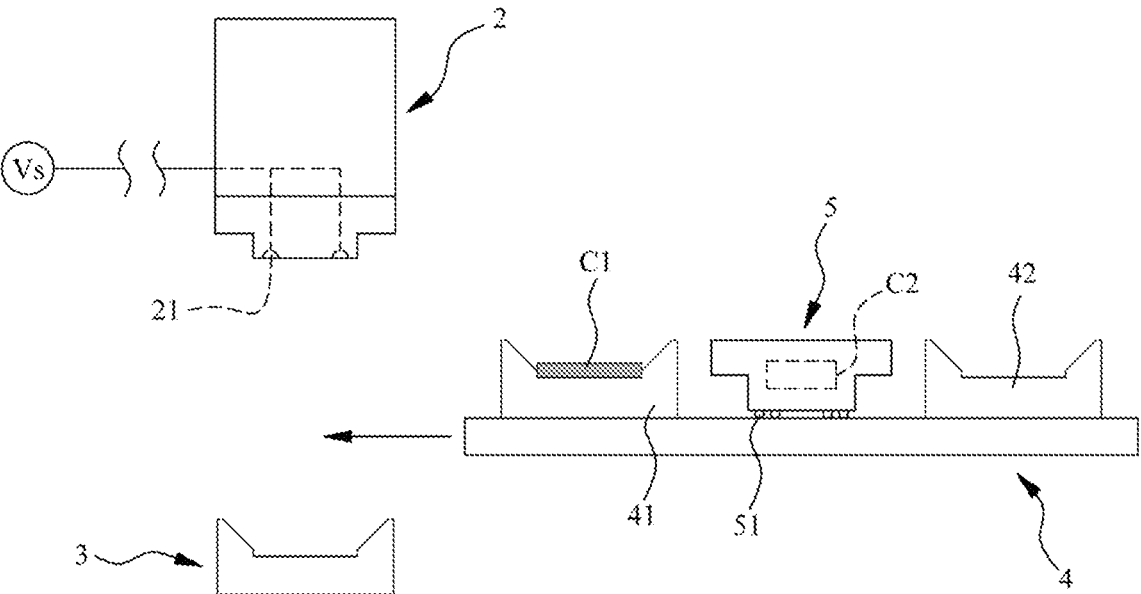
FIGS. 2A to 2G are schematic diagrams showing an operation flow of the first embodiment of the present invention.

Reference is made to FIG. 1 and FIG. 2A. FIG. 1 is an architecture diagram of an apparatus according to a first embodiment of the present invention, and FIG. 2A is a schematic diagram showing an operation flow of the first embodiment of the present invention. As shown in the figure, the apparatus according to the present embodiment mainly includes a pick-and-place device 2, a test socket 3, a mobile carrier 4, an upper chip holder 5, and a main controller 6. The test socket 3 is used to accommodate a first package device C1 and to perform the test of the first package device C1. The first package device C1 is a device under test, usually an integrated high-density digital or mixed-signal logic device. A second package device C2, which is usually a fully functional and defect-free integrated high-density or combined memory, is accommodated in the upper chip holder 5 so the second package device C2 is a device fixed in the upper chip holder 5 and may be replaced only when the process is changed. The lower surface of the upper chip holder 5 is provided with a plurality of contact terminals 51, to which the second package device C2 is electrically connected.

The pick-and-place device 2 of the present embodiment is a pressing head, which can be lifted and lowered, and the lower surface of the pick-and-place device 2 is provided with a plurality of suction nozzles 21, which are communicated with a negative pressure gas source Vs. The pick-and-place device 2 is disposed directly above the test socket 3, and the pick-and-place device 2 can be selectively lowered to approach the test socket 3 or lifted away from the test socket 3. The mobile carrier 4 of the present embodiment is a shuttle which is movable horizontally, and the mobile carrier 4 can selectively move to a position between the pick-and-place device 2 and the test socket 3 or move away from the position between the pick-and-place device 2 and the test socket 3. The mobile carrier 4 can carry an inputting-chip holder 41, an outputting-chip holder 42, and the upper chip holder 5, wherein the inputting-chip holder 41 is used to accommodate the first package device C1 to be tested, and the outputting-chip holder 42 is used to accommodate the first package device C1 which has been tested.

The main controller 6 of the present embodiment is electrically connected to the pick-and-place device 2, the test socket 3, and the mobile carrier 4 and is suitable for controlling the actions of these components. The main controller 6 may include one or more microprocessors, one or more digital signal processors, one or more memories, one or more input/output units, and one or more logic circuits capable of performing the same functions as these elements, such as an industrial computer or an automation controller.

Figure 2B:
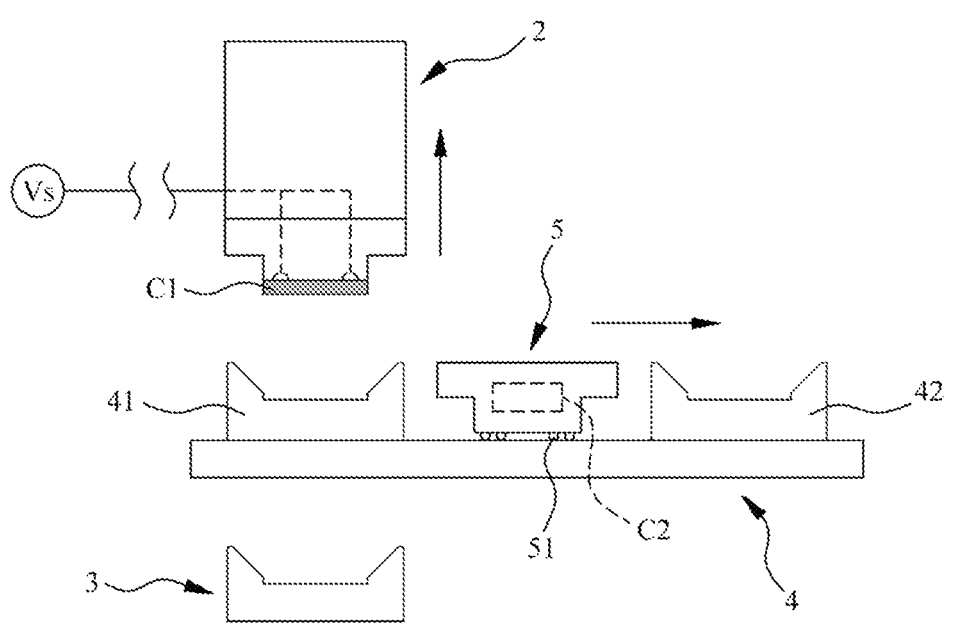
Figure 2C:
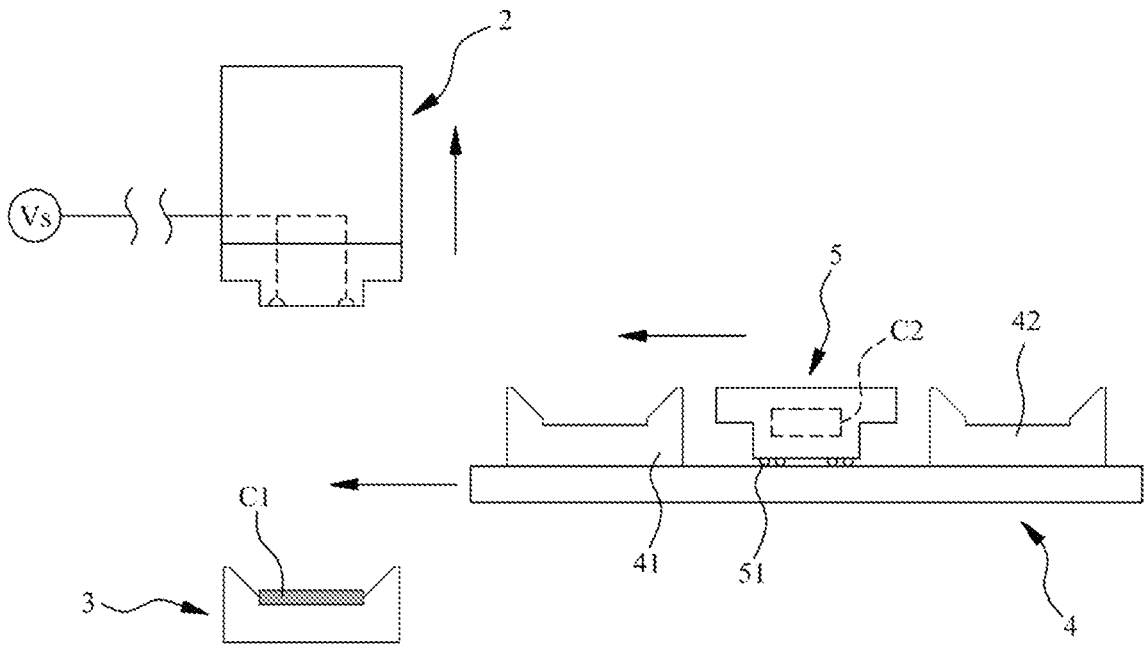

Reference is made to FIG. 2A to FIG. 2G which are schematic diagrams of the operation flow of the first embodiment of the present invention. First, as shown in FIG. 2A, the main controller 6 controls the mobile carrier 4 to move to a position between the pick-and-place device 2 and the test socket 3 so that the inputting-chip holder 41 on the mobile carrier 4 is positioned directly below the pick-and-place device 2. After that, the main controller 6 controls the pick-and-place device 2 to be lowered, to pick the first package device C1 from the inputting-chip holder 41 on the mobile carrier 4, and then to be lifted, as shown in FIG. 2B. Next, the main controller 6 controls the mobile carrier 4 to move away from the position between the pick-and-place device 2 and the test socket 3, and controls the pick-andplace device 2 to be lowered, to place the first package device C1 into the test socket 3, and then to be lifted, as shown in FIG. 2C.

Figure 2D:
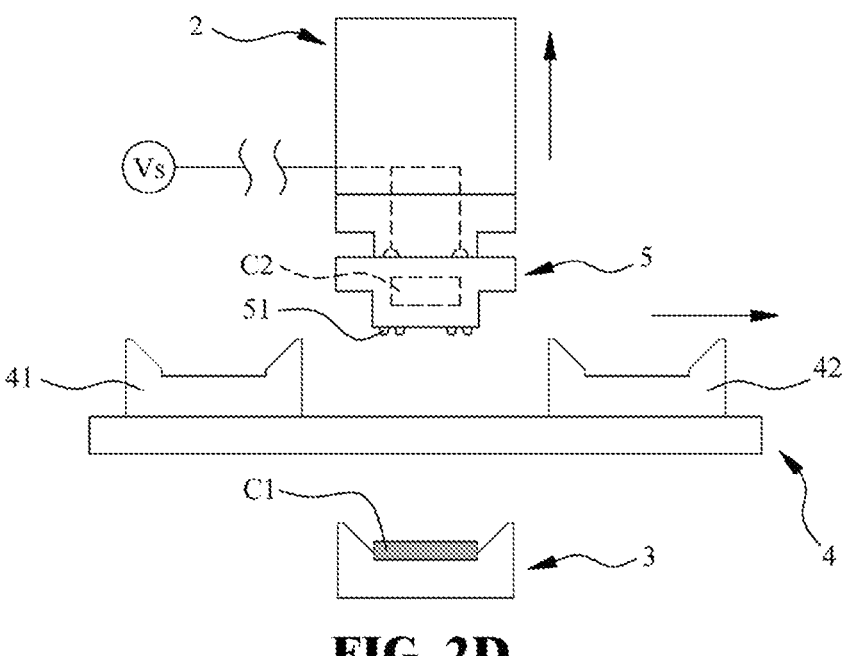
Figure 2E:
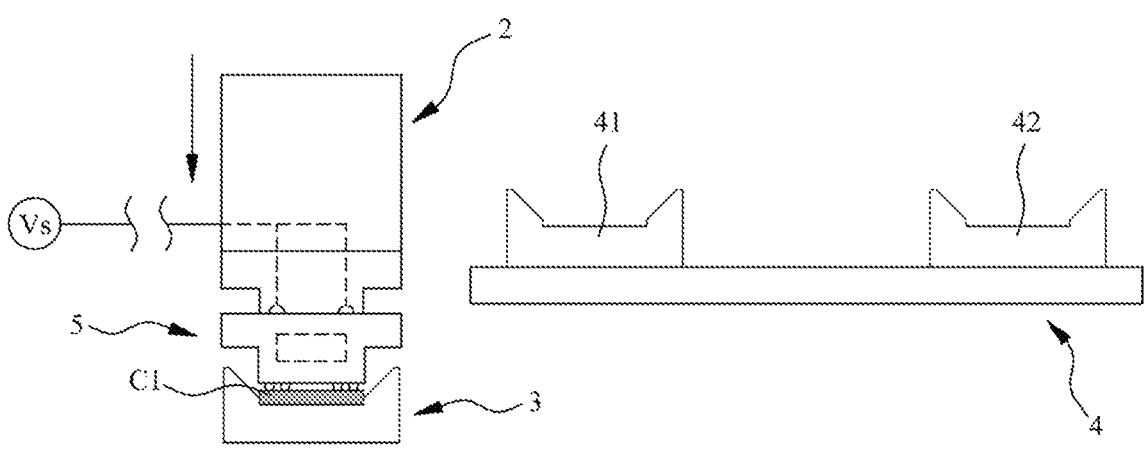

The main controller 6 controls the mobile carrier 4 to move to the position between the pick-and-place device 2 and the test socket 3 again so that the upper chip holder 5 on the mobile carrier 4 is positioned directly below the pick-and-place device 2, and controls the pick-and-place device 2 to be lowered, to pick the upper chip holder 5 from the mobile carrier 4, and then to be lifted, as shown in FIG. 2D. After that, the main controller 6 controls the mobile carrier 4 to move away from the position between the pick-and-place device 2 and the test socket 3, and the main controller 6 controls the pick-and-place device 2 to be lowered together with the upper chip holder 5 so that the plurality of contact terminals 51 are brought into electrical contact with the first package device C1 on the test socket 3 for testing the first package device C1. During the entire test, the pick-and-place device 2 is continuously abutted against the upper chip holder 5 and the first package device C1, as shown in FIG. 2E It should be noted that, in the present embodiment, the pick-and-place device 2 uses the plurality of suction nozzles 21 on its lower surface to suck and hold the upper chip holder 5. However, the present invention is not limited to the suction means implemented by negative pressure gas, and magnetic attraction, clamping mechanism, or other equivalent mechanisms capable of picking, placing, and holding the upper chip holder 5 can be applied to the present invention.

Figure 2F:
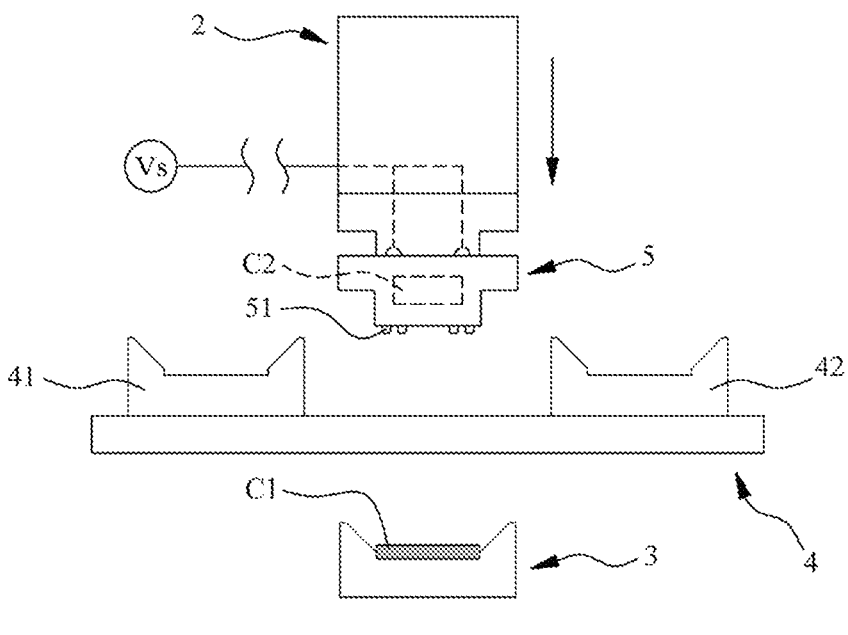

When the test is completed, the main controller 6 controls the pick-and-place device 2 to be lifted together with the upper chip holder 5, and the main controller 6 controls the mobile carrier 4 to move to the position between the pick-and-place device 2 and the test socket 3 so that the original position of the upper chip holder 5 on the mobile carrier 4 is directly below the pick-and-place device 2, as shown in FIG. 2F. Next, the main controller 6 controls the pick-and-place device 2 to be lowered, to place the upper chip holder 5 onto the mobile carrier 4, and then to be lifted, and the main controller 6 controls the mobile carrier 4 to move away from the position between the pick-and-place device 2 and the test socket 3.

Figure 2G:
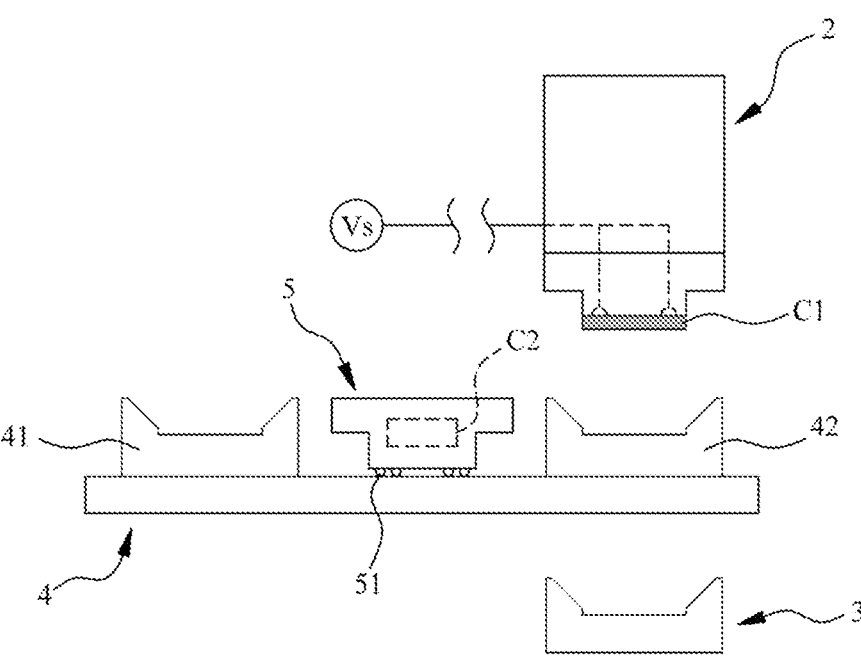

Finally, the main controller 6 controls the pick-and-place device 2 to be lowered, to pick the tested first package device C1 from the test socket 3, and then to be lifted, and the main controller 6 controls the mobile carrier 4 to move to the position between the pick-and-place device 2 and the test socket 3 so that the outputting-chip holder 42 on the mobile carrier 4 is positioned directly below the pick-and-place device 2, as shown in FIG. 2G. After that, the main controller 6 controls the pick-and-place device 2 to be lowered, to place the tested first package device C1 into the outputting-chip holder 42 on the mobile carrier 4, and then to be lifted. In this way, the test operation for the first package device C1 is completed and can be repeated again.

As compared with the prior art, in the present invention, the upper chip holder 5 in which one device (not the device under test) in the package-on-package semiconductor device is accommodated forms an independent modular component, and the upper chip holder 5 is used only when the test is to be carried out and placed in an appropriate position in a non-test state. Accordingly, the present invention can greatly simplify the overall architecture of the test machine, especially the pressing head, and this can be realized by simply modifying a traditional test machine, resulting in a simple, reliable, low-cost, high-test efficiency test machine.

As long as there is a need to change the process or change the device to be tested, only the test socket and the upper chip holder need to be replaced so that the process can be changed quickly and easily.

Figure 3:
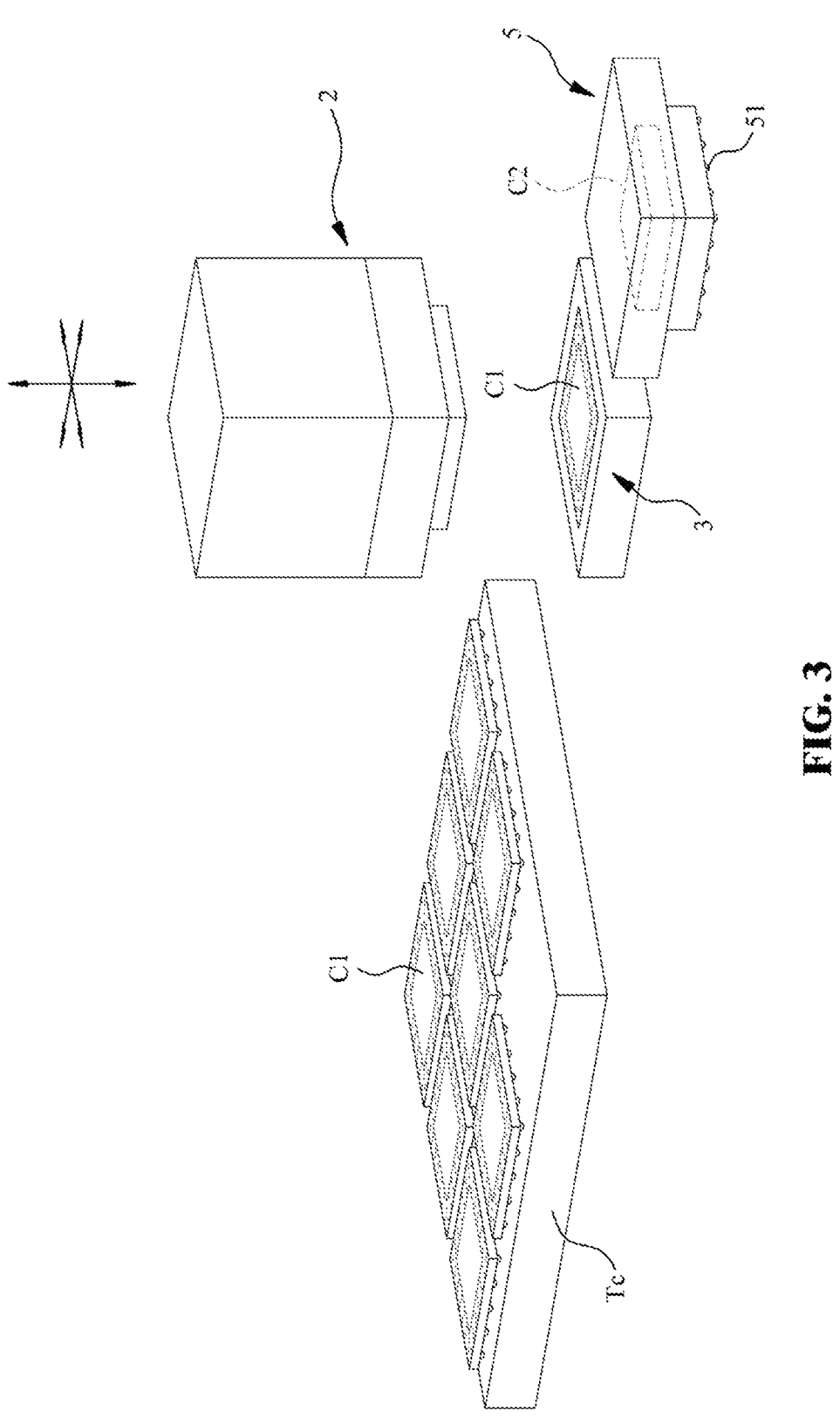
FIG. 3 is a schematic diagram of an apparatus according to a second embodiment of the present invention.

Reference is made to FIG. 3, which is a schematic diagram of an apparatus according to a second embodiment of the present invention. The main difference between the present embodiment and the first embodiment lies in that in the present embodiment, the mobile carrier 4 is removed, and the pick-and-place 2 is movable in three dimensions. The operation mode of the present embodiment will be further described as follows. First, the pick-and-place device 2 moves to a position above a temperature control platform Tc, is lowered to pick the first package device C1 to be tested, and then is lifted. The pick-and-place device 2 further moves to a position above the test socket 3, is lowered to place the first package component C1 into the test socket 3, and then is lifted. The temperature control platform Tc can be used to preheat or cool the submount of the package device be tested so as to facilitate the execution of the test at a high temperature or a low temperature. However, the present invention is not limited thereto. In the case that the temperature control is not required, the pick-and-place device 2 may pick the first package device C1 from a chip tray.

Next, the pick-and-place device 2 moves to a position above the upper chip holder 5, is lowered to pick the upper chip holder 5, and then is lifted. The pick-and-place device 2 moves the upper chip holder 5 to the position above the test socket 3 and is lowered together with the upper chip holder 5 so that the plurality of contact terminals 51 are brought into electrical contact with the first package device C1 on the test socket 3 for testing the first package device C1. During the test, the pick-and-place device 2 is continuously abutted against the upper chip holder 5 and the first package device C1 to ensure that the second package device C2 in the upper chip holder 5, the first package device C1, and the chip socket 5 are electrically connected to one another.

When the test is completed, the pick-and-place device 2 is lifted together with the upper chip holder 5 and places the upper chip holder 5 in its original position. After that, the pick-and-place device 2 moves to the position above the test socket 3 and picks the first package device C1 which has been tested. According to the test result, the pick-and-place device 2 transfers the first package device C1 to a good product tray or a defective product tray (not shown in the figure) which are provided for the reception of the tested devices. In this way, one test cycle is completed and can be repeated again.

It is noted that the present invention is not limited to the case that the pick-and-place device 2 which can be lifted and lowered cooperates with the mobile carrier 4 which is horizontally movable (as described in the first embodiment). The case that the upper chip holder 5 carrying the second package device C2 is formed as an independent modular component which is used only when a test is executed and is placed aside when the test is not executed does not depart from the main technical means of the present invention.

The preferred embodiments of the present invention are illustrative only, and the claimed inventions are not limited to the details disclosed in the drawings and the specification. Accordingly, it is intended that it have the full scope permitted by the language of the following claims.

The invention claimed is:

1. An apparatus for testing a package-on-package semiconductor device, comprising:
    a pick-and-place device;
    a test socket for accommodating a first package device;

an upper chip holder, in which a second package device is accommodated;
    a mobile carrier for carrying the first package device and the upper chip holder; and
    a main controller, electrically connected to the pick-and-place device, the mobile carrier and the test socket,
    wherein when the first package device is to be tested, the main controller controls the mobile carrier to move to a position between the pick-and-place device and the test socket, controls the pick-and-place device to pick the first package device from the mobile carrier, controls the mobile carrier to move away from the position between the pick-and-place device and the test socket, and controls the pick-and-place device to load the first package device into the test socket;
    then, the main controller controls the mobile carrier to move to the position between the pick-and-place device and the test socket, controls the pick-and-place device to pick the upper chip holder from the mobile carrier, controls the mobile carrier to move away from the position between the pick-and-place device and the test socket, and controls the pick-and-place device to transfer the upper chip holder and bring the upper chip holder into electrical contact with the first package device on the test socket so that the second package device is electrically connected to the first package device for execution of a test of the first package device;
    wherein when the test of the first package device is completed, the main controller controls the pick-and-place device to lift together with the upper chip holder, controls the mobile carrier to move to the position between the pick-and-place device and the test socket, controls the pick-and-place device to lower to place the upper chip holder into the mobile carrier and then lift, and controls the mobile carrier to move away from the position between the pick-and-place device and the test socket; and
    subsequently, the main controller controls the pick-and-place device to lower to pick the first package device from the test socket and then lift, controls the mobile carrier to move to the position between the pick-and-place device and the test socket, and controls the pick-and-place device to lower to place the first package device into the mobile carrier and then lift.

2. The apparatus of claim 1, wherein a lower surface of the upper chip holder is provided with a plurality of contact terminals, and the second package device is electrically connected to the plurality of contact terminals; when the first package device is to be tested, the main controller controls the pick-and-place device to move together with the upper chip holder so that the plurality of contact terminals are brought into electrical contact with the first package device on the test socket for execution of the test of the first package device.

3. The apparatus of claim 1, wherein the pick-and-place device includes at least one suction nozzle, which is arranged on a lower surface of the pick-and-place device and communicates with a negative pressure gas source.

4. A method for testing a package-on-package semiconductor device, comprising the steps of:
    (A) controlling a pick-and-place device to load a first package device into a test socket by a main controller, wherein the main controller controls a mobile carrier to move to a position between the pick-and-place device and the test socket, controls the pick-and-place device so that the pick-and-place device is lowered to pick the first package device from the mobile carrier and then lifted, and controls the mobile carrier to move away from the position between the pick-and-place device and the test socket and controls the pick-and-place device so that the pick-and-place device is lowered to place the first package device into the test socket and then lifted;

(B) controlling the pick-and-place device to pick an upper chip holder, in which a second package device is accommodated, by the main controller, wherein the main controller controls the mobile carrier to move to the position between the pick-and-place device and the test socket and controls the pick-and-place device so that the pick-and-place device is lowered to pick the upper chip holder from the mobile carrier and then lifted, and the main controller controls the mobile carrier to move away from the position between the pick-and-place device and the test socket;

(C) controlling the pick-and-place device to transfer the upper chip holder and bring the upper chip holder into electrical contact with the first package device on the test socket by the main controller so that the second package device is electrically connected to the first package device for execution of a test of the first package device;

(D) when the test of the first package device is completed, controlling the pick-and-place device so that the pick-and-place device is lifted together with the upper chip holder, controlling the mobile carrier to move to the position between the pick-and-place device and the test socket, controlling the pick-and-place device so that the pick-and-place device is lowered to place the upper chip holder into the mobile carrier and then lifted, and controlling the mobile carrier to move away from the position between the pick-and-place device and the test socket by the main controller; and (E) controlling the pick-and-place device so that the pick-and-place device is lowered to pick the first package device from the test socket and then lifted, controlling the mobile carrier to move to the position between the pick-and-place device and the test socket, and controlling the pick-and-place device so that the pick-and-place device is lowered to place the first package device into the mobile carrier and then lifted by the main controller.

* * * * *